United States Patent [19]

Filliman

[11] Patent Number: 4,797,634
[45] Date of Patent: Jan. 10, 1989

[54] CONTROLLED OSCILLATOR

[75] Inventor: Paul D. Filliman, Indianapolis, Ind.

[73] Assignee: RCA Licensing Corporation, Princeton, N.J.

[21] Appl. No.: 91,167

[22] Filed: Aug. 31, 1987

[51] Int. Cl.[4] .............................................. H03L 7/00
[52] U.S. Cl. ........................................ 331/12; 331/20; 331/25; 331/117 FE
[58] Field of Search .................. 331/8, 10, 11, 12, 18, 331/20, 25, 117 FE; 329/122, 124; 328/133, 155; 307/527; 455/260, 265

[56] References Cited

U.S. PATENT DOCUMENTS 4,020,500  4/1977  Harwood ............................... 358/19
4,731,844  3/1988  Christopher .......................... 381/13

OTHER PUBLICATIONS

An Application Note 81 entitled Phased-Lock Loop FM Stereo Demodulator by T. D. Isbele, et al, Dated 1973.

*Primary Examiner*—Eugene R. LaRoche
*Assistant Examiner*—Robert J. Pascal
*Attorney, Agent, or Firm*—Paul J. Rasmussen; Joseph J. Laks; Sammy S. Henig

[57] ABSTRACT

A controlled crystal oscillator of a stereo decoder of a television receiver using CMOS technology includes first, second and third differential emplifiers that produce corresponding first, second and third pairs of antiphase output signals. The first and second differential amplifiers have variable gains that vary in opposing manners in accordance with a frequency control signal. The oscillatory signal of a crystal is coupled to corresponding input terminals of the three differential amplifiers such that the phase of the signal that is developed at the input terminal of the third differential amplifier is phase-shifted by approximately 90° relative to those developed at the input terminals of the other two amplifiers. The three pairs of output signals are combined to form a single-ended oscillatory signal that is coupled back to the crystal to complete a regulative feedback path. The frequency of oscillation is determined in accordance with the frequency control signal.

21 Claims, 4 Drawing Sheets

CONTROLLED OSCILLATOR

BACKGROUND OF THE INVENTION

The invention relates to a controlled oscillator is used in, for example, a stereo decoder of a television apparatus.

Typical baseband composite audio stereo signals include a main signal formed from the sum of the left and right channel signals (L+R), a pilot signal having a frequency $\omega_p$ which is greater than the maximum frequency of the (L+R) signal, and a difference signal (L−R) which is the difference between the left and right channel signals. The difference signal is in the form of a double sideband, amplitude modulated suppressed carrier centered at a frequency of twice $\omega_p$. The pilot signal is essential for demodulating the suppressed carrier to extract the (L−R) audio information.

The demodulated (L−R) signal will nominally include a component corresponding to the pilot signal, and the maximum signal frequency of the (L+R) signal is nominally relatively close to the pilot signal frequency.

In such stereo decoder, a phase-lock-loop circuit (PLL) may be used for generating, for example, a signal at the frequency $2x\omega_p$ that is synchronized to the pilot signal and that is used demodulating the (L−R) signal.

SUMMARY OF THE INVENTION

In carrying out an aspect of the invention, in a stereo decoder apparatus, responsive to a baseband composite audio signal that includes a pilot signal component, a controllable oscillator responsive to a control signal is included. The oscillator generates an oscillatory output signal at a frequency that is controlled in accordance with the control signal. The controllable oscillator includes a differential, first amplifier for generating first and second output signals that are opposing in phase. A second amplifier of the oscillator generates a third output signal. At least one of the amplifiers is responsive to the control signal for varying an amplitude of one of the first, second and third output signals when the control signal varies. A resonator responsive to the oscillatory output signal generates at an output terminal thereof a second oscillatory signal that is coupled to the first and second amplifiers. The resonator has a frequency response that determines a range of frequencies from which the frequency of the oscillatory signal can be selected. A phase shift is provided to one of the first, second and third output signals relative to at least another one of the first, second and third output signals. The first, second and third output signals are combined for generating the oscillatory output signal. The control signal is generated in accordance with the pilot signal component and the oscillatory signal. The control signal varies the amplitude of one of the first, second and third output signal for synchronizing the oscillatory output signal to the pilot signal component.

In carrying out another aspect of the invention, two variable gain differential amplifiers that are constructed each using a pair of MOS transistors have corresponding gains that are controlled in accordance with a control signal. The gain of each differential amplifier is varied by a third MOS transistor that is coupled at a junction between the pair of MOS transistors that form such differential amplifier. The conductivity of the third MOS transistor varies in accordance with the control signal. By selecting a predetermined channel geometry of the third MOS transistor, for example, establishing the gain parameter of the variable gain amplifier is, advantageously, simplified.

In accordance with a further aspect of the invention, a crystal having a narrow band width that is coupled in the regenerative feedback network makes the oscillator a voltage controlled crystal oscillator (VCXO). The crystal causes noise and jitter in the VCXO output signal to be, advantageously, reduced that, in turn, reduces distortions in, for example, the extracted (L−R) audio information.

In accordance with a yet further aspect of the invention, the VCXO utilizes a Pierce type arrangement in the regenerative feedback loop that, advantageously, provides signal stability.

DESCRIPTION OF THE PREFERRED EMBODIMENTS

Figure 1:
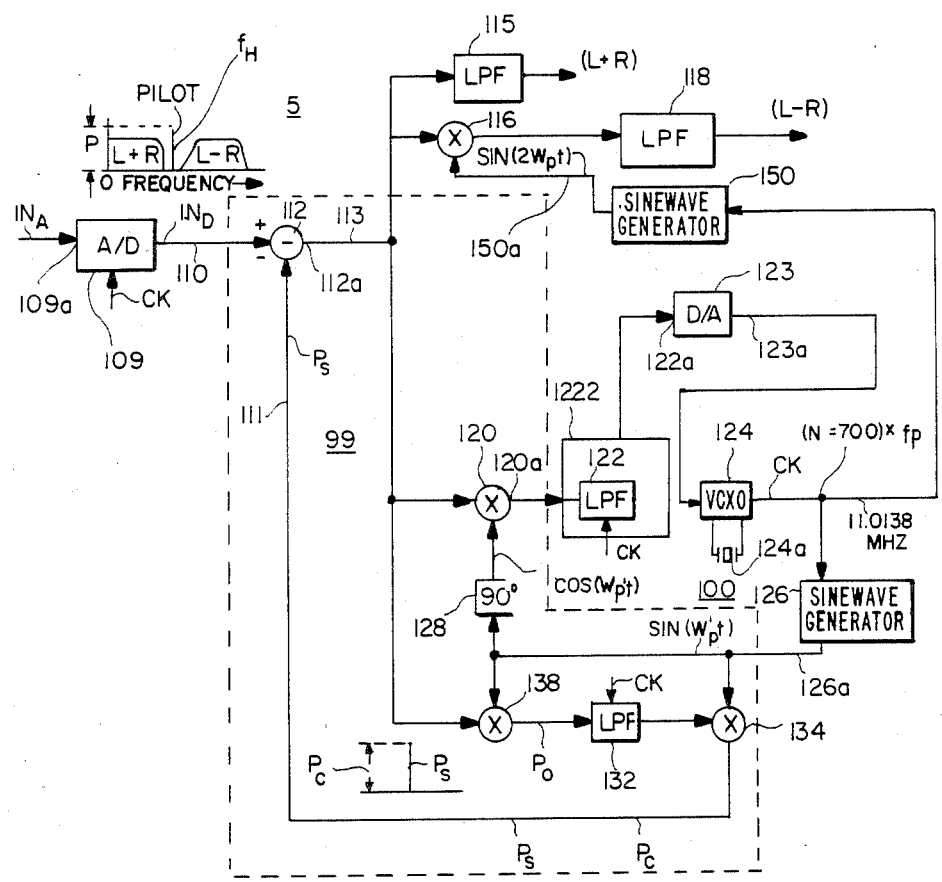
FIG. 1 illustrates a block diagram of a portion of a stereo decoder that includes a voltage controlled crystal oscillator, embodying an aspect of the invention.

In FIG. 1, a composite audio stereo signal $IN_a$ that is obtained from, for example, an FM decoder of a television receiver, not shown in the figures, is coupled to an input terminal 109a of an analog-to-digital converter 109 that generates a composite signal $IN_D$. Signal $IN_D$ is a digital representation of a signal having a frequency composition similar to the spectral waveform 5 that contains a pilot signal component PILOT. Signal component PILOT is, in the BTSC standard, at a frequency $W_p$ that is equal to the horizontal scan frequency, $f_H$.

Signal $IN_D$ is applied via a conductor 110 to the minuend input terminal of a signal subtraction circuit 112 of a phase-lock-loop circuit (PLL) 100. A synthesized pilot signal $P_s$ is coupled via connection 111 to the subtrahend input terminal of subtraction circuit 112. Subtraction circuit 112 provides a composite signal 112a, with the pilot signal component substantially eliminated, at its output connection 113. Subtraction circuit 112 is included in a circuit 99 shown within the dashed-line. Circuit 99 performs the analogous function of a phase detector in a conventional PLL.

Signal 112a is also coupled to a low-pass filter 115 which passes, or separates the (L+R) signal to the substantial exclusion of higher frequency components of the composite signal. Since the pilot signal component is not present in the signal applied to filter 115, the frequency cut off characteristcs of filter 115 are, advantageously, significantly less critical than if the pilot signal component were present.

Output signal 112a from subtraction circuit 112 is, additionally, coupled to one input of a multiplier circuit 120 that is included in circuit 99. The output developed by the multiplier 120 is coupled to serially coupled circuit elements including an arrangement 1222, an digital-to-analog converter 123, a voltage controlled crystal oscillator (VCXO) 124, embodying an aspect of the invention, a sinewave generator circuit 126 and a 90° phase shifter 128. Arrangement 1222 includes a low-pass filter 122 and an error accumulator that is not shown in the FIGURES.

Low-pass filter 122 of arrangement 1222, having a cutoff frequency that is substantially lower than that of pilot signal component PILOT, low-pass filters the digital output words at a port 120a of multiplier 120 to produce an error word, not shown in FIG. 1, that is representative of a phase or of a frequency error between signal component PILOT and an output signal CK of VCXO 124, as described later on. Such digital error word is then periodically accumulated in the error accumulator of arrangement 1222, that is not shown in the FIGURES, every, for example, ⅔ of the period of pilot signal component PILOT, to produce a frequency control word 122a that contains the periodically accumulated error. Word 122a is converted in a digital-to-analog converter 123 that produces an equivalent, analog signal 123a that remains substantially constant between the above-mentioned periodic accumulation intervals. Signal 123a is coupled to an input terminal of VCXO 124 to establish the output frequency produced thereby.

For a zero average value of the signal at port 120a of multiplier 120, VCXO 124 develops output signal CK having a frequency that is substantially equal to a predetermined integer multiple N of the frequency, $\omega_p$, of pilot signal component PILOT.

Output signal CK from VCXO 124 is applied to sinewave generator 126 which develops a signal 126a that provides a digital representation of a sinusoidal signal, $\sin(\omega_p't)$, that is in the same frequency and in the same phase as pilot signal component PILOT. Sinewave generator 26 may include, for example, a counter that counts pulses of signal CK and a read-only-memory (ROM), having an address port that is coupled to an output word of the counter, such that signal 126a is produced at an output port of such ROM. Generator 126 establishes the value of integer N that was mentioned before, to be equal, for example, to 700, in accordance with the ratio between the frequency of signal CK and that of signal 126a generated by generator 126. Output signal 126a of sinewave generator 26 is coupled to phase shifter 128 which develops, in a well known manner, a cosine signal of at the same frequency of, but is a phase that is shifted by 90°, which signal corresponds to the expression $\cos(\omega_p't)$.

Standard FM and BTSC baseband composite audio signals, C(t), can be described by the equation $$C(t) = S(t) + P\sin(\omega_p t) + D(t)\sin(2\omega_p t) \quad (1)$$

where C(t) corresponds to signal $IN_D$, and S(t) and D(t) correspond to the time varying (L+R) and (L−R) signals respectively, P is the amplitude, and $\omega_p$ the radian frequency of pilot signal component PILOT.

Synthesized pilot signal $P_s$, applied to subtraction circuit 112, is developed by measuring the amplitude of the residual pilot signal at the output of subtraction circuit 112, effectively amplifying the residual amplitude, and multiplying this value by the output of sinewave generator 126.

Assume that the amplitude, $P_c$, of synthesized pilot signal $P_s$ exactly equals the amplitude P of pilot signal component PILOT. Also, the synthesized pilot signal $P_s$ can be represented as $P_c\sin(\omega_p't)$. The value C(t)' obtained from subtraction circuit 112 that is representative of signal 112a may be expressed as $$C'(t) = S(t) + P\sin(\omega_p t) - P_c\sin(\omega_p't) + D(t)\sin(2\omega_p t). \quad (2)$$

The value C'(t) is multiplied in multiplier 120 by $\cos(\omega_p't)$ to yield $$C'(t)\cos(\omega_p't) = S(t)\cos(\omega_p't) + P\sin(\omega_p t)\cos(\omega_p't) - \quad (3)$$
$$P_c\sin(\omega_p't)\cos(\omega_p't) + D(t)\sin(2\omega_p t)\cos(\omega_p't).$$

The first and last terms in equation (3) are sinusoids which will average to zero in the low-pass filter 122. The center two terms, $P\sin(\omega_p t)\cos(\omega_p't) - P_c\sin(\omega_p't)\cos(\omega_p't)$, may be shown, by manipulating trigonometric identities, to be equivalent to $$P/2(\sin(\omega_p t - \omega_p't) + \sin(\omega_p t + \omega_p't) - \sin(2\omega_p't)). \quad (4)$$

The two rightmost terms are relatively high frequency sinusoids and will average to zero in the low-pass filter 122. Since the nominal output frequency of signal 126a of sinewave generator 126 is established close to $\omega_p$, the argument $(\omega_p t - \omega_p't)$ of the first term of expression (4) will be close to zero. The term $\sin(\omega_p t - \omega_p't)$ will be a very low frequency sinusoid and will not average to zero unless $\omega_p'$ equals $\omega_p$. Therefore, as long as the frequency $\omega_p'$ is different from the pilot frequency $\omega_p$, multiplier 120 and low-pass filter 122 will periodically vary signal 122a that is applied to VCXO 124 in a negative feedback manner that will tend to synchronize signal 126a of sinewave generator 126 to pilot signal component PILOT.

Next, consider, for example, that $\omega_p'$ and $\omega_p$ are identical frequencies but that synthesized pilot signal $P_s$ and pilot signal component PILOT are out of phase by $\Delta$ degrees. In this instance, the output of multiplier 120 takes the form.

$$C'(t)\cos(\omega_p t + \Delta) = \quad (5)$$
$$S(t)\cos(\omega_p' + \Delta) + P\sin(\omega_p t)\cos(\omega_p t + \Delta) - $$
$$P_c\sin(\omega_p t + \Delta)\cos(\omega_p t + \Delta) + D(t)\sin(2\omega_p t)\cos(\omega_p t + \Delta).$$

The first and fourth terms on the right hand side of equation will average to zero in low-pass filter 122 since they represent sinusoidal signals having frequencies relatively high compared to the reciprocal time constant of the filter. The two middle terms can be shown to be equivalent to $$P/2(\sin(2\omega_p t + \Delta) + \sin\Delta - \sin(2\omega_p t + 2\Delta)). \quad (6)$$

The first and third terms are relatively high frequency sinusoidal signals and will average to zero in low-pass filter 122 of PLL 100. The remaining term, $P/2\sin\Delta$, is substantially a DC term and, thus, will be passed by the low-pass filter 122 and provide a phase correction term to VCXO 124. Thus, as long as a frequency or phase error exists, multiplier 120 and low-pass filter 122 vary signal 123a. If no error exists, signal 123a remains constant.

Signal CK is coupled to an input terminal of a sinewave generator 150 that generates a signal 150a that is a digital representation of a sinewave at the radian frequency $2\omega_p$. Sinewave signal 150a is coupled to a multiplicand input port of a multiplier 116. Composite signal $IN_D$, less the synthesized pilot signal $P_s$ obtained from subtraction circuit 112, is coupled to respective multiplicand input terminals of multipliers 116 and 130. Signal 150a from sinewave generator 150, that varies in accordance with the expression sin(2ω$_p$t), is applied to a multiplier input terminal of multiplier 116 to produce the signal (L−R)', described by the equation $$(L - R)' = S(t)\sin(2\omega_p t) + D(t)\sin(2\omega_p t)\sin(2\omega_p t) \quad (7)$$
$$= S(t)\sin(2\omega_p t) + D(t)(1 - \cos^2(2\omega_p t)) \quad (8)$$

which is applied to a low-pass filter 118. Low-pass filter 118 is designed to pass only the baseband term D(t), thus the (L−R) signal is separated.

The output from subtraction circuit 112 is multiplied by the term sin(ω$_p$t) in multiplier 130. Therefore, output signal P$_o$ of multiplier 130 may be expressed as $$P_o = S(t)\sin(\omega_p t) + P\sin(\omega_p t)\sin(\omega_p t) - P_c\sin(\omega_p t)\sin(\omega_p t) + D(t)\sin(2\omega_p t)\sin(\omega_p t). \quad (9)$$

The term P$_c$sin(ω$_p$t)sin(ω$_p$t) corresponds to the pilot cancelling signal, as described in detail in U.S. patent application No. 882,384 entitled APPARATUS FOR CANCELLING A PILOT SIGNAL FROM A COMPOSITE SIGNAL, in the name of Todd Christopher and incorporated by reference herein. Signal P$_o$ is applied to a low-pass filter 132 which integrates the signal over a relatively long period compared to 2π/ω$_p$. An output signal of filter 132, applied to multiplier 134 is multiplied by signal 126a of generator 126 to generate synthesized pilot signal P$_s$.

Figure 2:
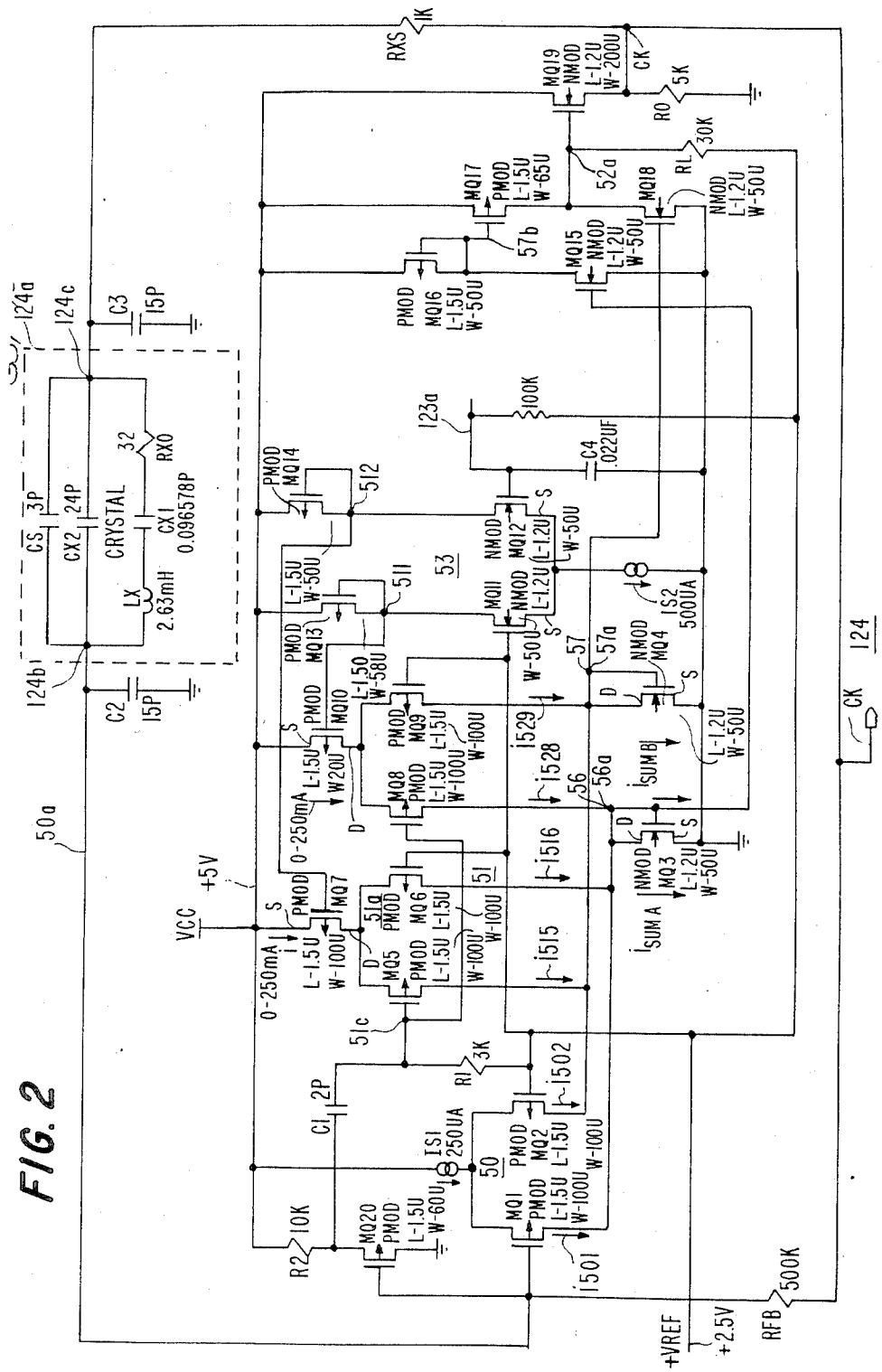
FIG. 2 illustrates a detailed embodiment of the oscillator of FIG. 1.

FIG. 2 illustrates a detailed embodiment of VCXO 124 of FIG. 1, embodying an aspect of the invention. Similar numerals and symbols in FIGS. 1 and 2 illustrate similar items or functions. In FIG. 2, sinewave signal 50a at a frequency, for example, 700xf$_p$, where f$_p$ is equal to the horizontal scan frequency f$_H$ in the BTSC standard, is developed at a terminal 124b of a crystal 124a, shown in FIG. 2 in electrical equivalent form. Signal 50a is coupled to an input terminal of a differential amplifier 50, embodying a feature of the invention, that includes PMOS transistors MQ1 and MQ2. A common current source IS1 that is formed by utilizing CMOS technology, not shown in detail in FIG. 2, is coupled to a junction terminal between the source electrodes of transistors MQ1 and MQ2. Consequently, complementary currents i501 and i502, having, each, a sinewave waveform, are produced at the drain electrodes of transistors MQ1 and MQ2, respectively. Thus, current i501 is in anti-phase with signal 50a; whereas, current i502 is in phase with signal 50a.

A phase control stage 51, embodying another feature of the invention, includes differential amplifiers 51a and 51a b having corresponding variable gains that vary in an opposite manner. Amplifier 51b includes a pair of PMOS transistors MQ8 and MQ9. Amplifier 51a includes a pair of PMOS transistors MQ5 and MQ6. A phase shifting arrangement that includes a transistor MQ20, coupled as a source follower, a capacitor C1 and a resistor R1 produces a sinewave signal 51c, having a phase lead of, approximately, 90° relative to signal 50a. Signal 51c is coupled to the gate electrodes of transistors MQ5 and MQ8 of amplifiers 51a and 51b, respectively. The gate electrodes of transistors MQ6, MQ9 and MQ2 are coupled to a reference voltage VREF that establishes the average DC voltage at the gate electrodes of each of transistors MQ1, MQ5, MQ6, MQ8 and MQ9.

A PMOS transistor MQ7 having a drain electrode that is coupled at a junction between the source electrodes of transistors MQ5 and MQ6 forms a variable or controllable current source that varies in accordance with a controllable signal 512. Signal 512 is produced in a differential control amplifier 53. Amplifier 53 includes a pair of NMOS transistors MQ11 and MQ12. A constant current source IS2 is coupled at a junction terminal between the source electrodes of transistors MQ11 and MQ12. The gate electrode of transistor MQ11 is coupled to reference voltage VREF, and that of transistor MQ12 is coupled to frequency control signal 123a of FIG. 1, that was mentioned before, that controls the frequency of VCXO 124.

A PMOS transistor MQ14 having a drain electrode that is coupled to the drain electrode of transistor MQ12 develops signal 512, that was mentioned before, at the junction between transistors MQ14 and MQ12. The gate electrode of transistor MQ14 is coupled to its drain electrode, thus establishing a resistive load at the drain of transistor MQ12. Consequently, signal 512 varies when signal 123a varies to cause the current in transistor MQ7, operating as a common current source of differential amplifier 51a, to vary.

In accordance with a feature of the invention, the ratio between the current that flows in transistor MQ14 that is controlled by signal 123a and between the current that flows in transistor MQ7 is established by specifying the corresponding channel geometries of transistors MQ7 and MQ14, as indicated by dimensions L and W in FIG. 1. Dimensions L and W represent the channel length and width, respectively. In this way, obtaining the required gain parameter is, advantageously, facilitated. A variation in the level of frequency control signal 123a causes the gain of amplifier 51a to vary. The gain of amplifier 51a may be defined by the ratio between current i515 or i516 that flows in transistor MQ5 or MQ6, respectively, and between signal 51c.

In accordance with another feature of the n, the magnitude of each of current i516, that is in phase with signal 51c *and that of current i515 that is in anti-phase, changes in the same sense or direction when signal 123a changes.*

Differential amplifier 51b that operates similarly to amplifier 51a generates sinewave currents i528 and i529 that are in phase with currents i515 and i516, respectively. Thus, currents i529 and i528 are in anti-phase and are complementary. Transistors MQ8, MQ9 and MQ10 of amplifier 51b perform the analogous functions to transistors MQ5, MQ6 and MQ7, respectively, of amplifier 51a. However, a gain control signal 511 that is coupled to the gate electrode of tranistor MQ10 changes in the opposite sense or direction to gain control signal 512 at the gate electrode of transistor MQ7 when a change in frequency control signal 123a occurs.

Signal 511 is developed at a junction between a PMOS transistor MQ13 that is coupled to the drain electrode of transistor MQ11. Load forming transistor MQ13 performs the analogous function as transistor MQ14, that was described before, except that it causes signal 511 to vary in the opposite sense to that of signal 512 when a change in frequency control signal 123a occurs. Consequently, the current in transistor MQ10 decreases, for example, when the current in transistor MQ7 increases as a result of a corresponding change in frequency control signal 123that causes the gain of amplifier 51a to increase. The decrease in the current in transistor MQ10 causes the corresponding gain in amplifier 51b to decrease.

Currents i501, i516 and i528 of amplifiers 50, 51a and 51b, respectively, are summed at a terminal 56 and a resulting sum current $i_{SUMA}$ that flows in an NMOS transistor MQ3 develops a signal 56a. Signal 56a is proportional to sum current $i_{SUMA}$ because transistor MQ3, having its gate electrode coupled to its drain electrode, operates as a resistive load. Similarly, currents i502, i515 and i529 are summed at a terminal 57 and a resulting sum current $i_{SUMB}$ that flows in an NMOS transistor MQ4 develops a proportional signal 57a that is substantially equal in magnitude and opposite in phase to signal 56a. Thus signals 57a and 56a are complementary.

Signal 57a is coupled to the gate electrode of an NMOS transistor MQ18; whereas, signal 56a is coupled through an inerter stage that is formed by transistors MQ15 and MQ16 to form a signal 57b that is coupled to a gate electrode of a PMOS transistor MQ17. In the inverter stage, transistor MQ16 operates as a resistive load. Consequently, current that flows in transistor MQ17 has a magnitude that is determined by the respective channel geometries of transistors MQ15, MQ16 and MQ17. Thus, by specifying the channel geometries, the design of the required gain parameters is, advantageously, simplified.

In accordance with a further aspect of the invention, PMOS transistor MQ17 and NMOS transistor MQ18, operating in a push-pull configuration, produce a signal 52a at a junction terminal between transistors MQ17 and MQ18 that is representative of the sum of the magnitudes of signals 57a and 56a. Therefore, by using complementary signals 56a and 57a to obtain single ended sum signal 52a, the magnitude of signal 52a is advantageously larger than if only one of signals 56a and 57a were used.

Sum signal 52a is coupled through an NMOS transistor MQ19, operating as a source follower, to form oscillatory signal CK. Signal CK is coupled through an RC network that includes a resistor RX5 and a capacitor C3 to a terminal 124c of crystal 124a to complete a regenerative positive feedback loop signal path of oscillator 124 when oscillatory signal CK is coupled via crystal 124a back to the reference starting terminal 124b of the feedback loop. Signal 50a, that was mentioned before, is developed across a capacitor C2 that is coupled to terminal 124b.

VCXO 124 will produce oscillatory signal CK at a frequency that will cause a total of 0° phase shift of signal 50a at, for example, terminal 124b after signal 50a traverses the entire feedback loop signal path. The phase shift between the phase of signal 50a and that of the signal at terminal 14c associated with crystal 124a is significantly frequency dependent. Crystal 124a functions in such a way that the phase of signal 50a lags that of the signal at terminal 124c by less than 180°. By having amplifiers 50, 51a, 51b vary the phase between signals CK and signal 50a, in accordance with frequency control signal 123a, the oscillation frequency of signal CK can be controllably changed.

Figure 3:
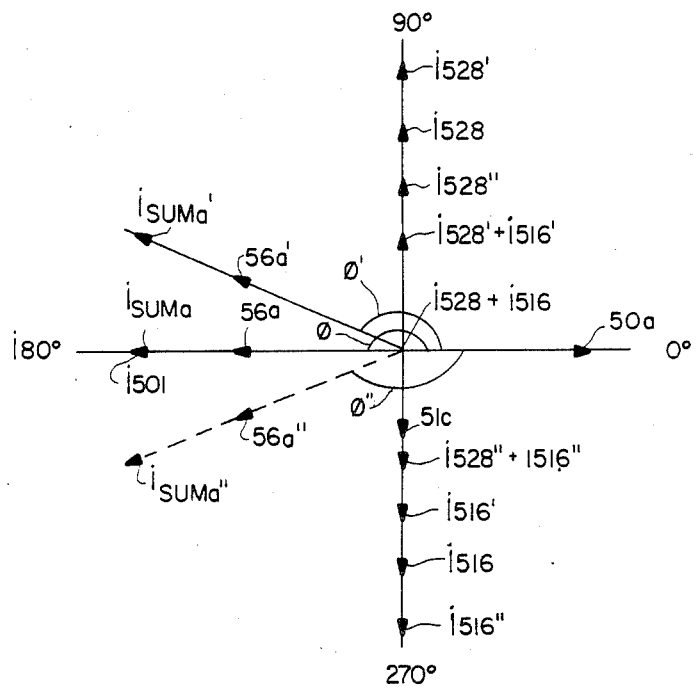
FIG. 3 illustrates a graph useful in explaining the operation of the circuit of FIG. 3.

FIG. 3 depicts a vector diagram illustrating the range of phase variation of signal CK relative to signal 50a. Similar numbers and symbols in FIGS. 1, 2 and 3 indicate similar items or functions. Since signal CK of FIG. 2 is in phase and is proportional in magnitude to signal 56a, for example, it is sufficient to show in FIG. 3 the contribution signal 56a to the phase of signal CK and, for the sake of explanation, to disregard the contribution of signal 57a. In FIG. 3, signals 50a, 51c and i501 are shown with the corresponding correct phase relationship but with arbitrary predetermined magnitudes.

In a first example, the vectors representing currents i528 and i516 have respective equal magnitudes as established in accordance with a particular value of signal 123a of FIG. 2, representing one extreme end of a range of values that signal 123a may assume. In the first example, each of signal 56a and current $i_{SUMA}$ of FIG. 3, that is equal to the vector sum of currents i501, i528 and i516, is at an angle that is equal to 180° relative to signal 50a.

In a second example, that corresponds with signal 123a being less positive than in the first example, the magnitude of current i528' is larger than that of current i516'. Consequently, each of current $i_{SUMA}'$ and signal 56a' is leading signal 50a by a phase $\phi'$ that is less than 180°.

Thus, by varying signal 123a of FIG. 2, the phase of signal 56a or CK varies that causes frequency of signal CK to change accordingly.

In a third example, that corresponds with signal 123a being more positive than in the first example, the magnitude of current i516" is larger than that of current i528". Consequently, each of current $i_{SUMA}$ and signal 56a" is lagging after signal 50a by a phase $\phi''$ that is less than 180°. Because crystal 124a can cause a phase lag of no more than 180°, as mentioned before, the total phase shift after signal 50a traverses the entire feedback loop signal path, in the third example, cannot be zero. Therefore, the third example may represent an undesirable or abnormal condition that prevents VCX0 124 from operating.

Figure 4:
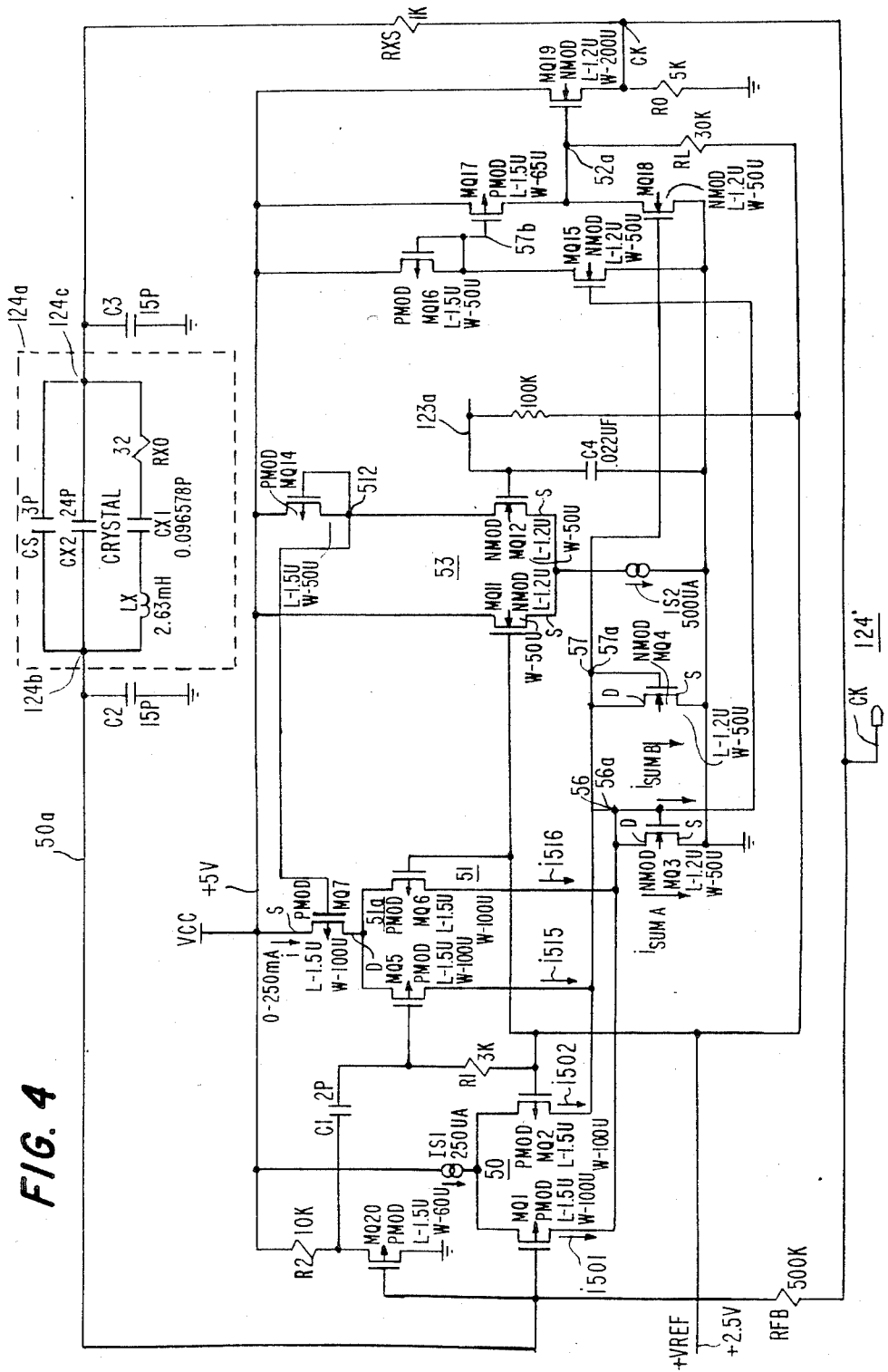
FIG. 4 illustrates a second detailed embodiment of the oscillator of FIG. 1.

FIG. 4 illustrates a VCXO 124', embodying another aspect of the invention, that represents a second embodiment of VCXO 124 of FIG. 1. Similar numerals and symbols in FIGS. 1, 2, 3 and 4 illustrate similar items or functions. VCXO 124' of FIG. 4 is identical and operates similarly to, VCXO 124 of FIG. 2 except that differential amplifier 51b and transistor MQ13 of FIG. 1 have been eliminated from VCXO 124' of FIG. 4. Thus, advantageously, only two differential amplifiers, 50 and 1a, of FIG. 4 perform the function of three differential amplifiers 50, 51a and 51b, of FIG. 2. Furthermore, because amplifier 51b of FIG. 1 has no corresponding amplifier in VCXO 124' of FIG. 4, a situation such as the third example that was discussed before, advantageously, cannot occur in VCXO 124' of FIG. 4. Consequently, signal 123a of FIG. 4 may assume values that are more positive than in the first example that was discussed before.

VCXO 124 operates as a Pierce type oscillator that is, advantageously, a stable oscillator. By varying the phase $\phi$ between signals 56a or CK and signal 50a, PLL 100 of FIG. 1 generates signal CK that is synchronized to pilot signal component PILOT.

What is claimed:

1. A stereo decoder apparatus responsive to a baseband composite audio signal that includes a pilot signal component, comprising:
   a controllable oscillator responsive to a control signal, said oscillator generating an oscillatory output signal at a frequency that is controlled in accordance with said control signal, said controllable oscillator including:
   a differential, first amplifier for generating first and second output signals that are opposing in phase;
   a second amplifier for generating a third output signal, at least one of said amplifiers being responsive to said control signal for varying an amplitude of one of said first, second and third output signals when said control signal varies;

a resonator responsive to said oscillatory output signal for generating at an output terminal thereof a second oscillatory signal that is coupled to said first and second amplifiers, said resonator having a frequency response that determines a range of frequencies from which said frequency of said oscillatory signal can be selected;

reactive means coupled to said second oscillatory signal and to one of said amplifiers for providing a phase shift to one of said first, second and third output signals relative to at least another one of said first, second and third output signals;

combining means for combining said first, second and third output signals for generating said oscillatory output signal; and means responsive to said pilot signal component and to said oscillator signal for generating said control signal to vary said amplitude for synchronizing said oscillatory output signal to said pilot signal component.

2. An apparatus according to claim 1 wherein a gain of said second amplifier varies in accordance with said control signal.

3. An apparatus according to claim 2 wherein said second amplifier, generates a fourth output signal such that said third and fourth output signals that are at opposite phases have corresponding amplitudes that vary in accordance with said control signal and wherein said combining means combines all output signals to generate said oscillatory signal at a corresponding single terminal that causes said oscillatory signal to be larger than if only one of said output signals of said first amplifier was combined with only one of said output signals of said second amplifier.

4. An apparatus according to claim 1 wherein said pilot signal component is included in a television baseband television signal.

5. An apparatus according to claim 1 wherein a gain of said first amplifier is constant and that of said second amplifier varies in accordance with said control signal.

6. An apparatus according to claim 5 wherein said second amplifier comprises first and second of MOS transistors that are coupled as a differential amplifier, a third MOS transistor having a control electrode that is coupled to said control signal, said third MOS transistor having a main current conducting electrode that is coupled at a junction terminal between corresponding main current conducting electrodes of said first and second MOS transistors to provide a common source of current to both said first and second MOS transistors such that a variation in said control signal causes a corresponding conductivity variation in said third MOS transistor that causes a corresponding current that flows in each of said first and second MOS transistors to vary in a direction that, in both said first and second MOS transistors, is the same, causing said gain of said variable gain amplifier to vary in accordance with said control signal.

7. An apparatus according to claim 6 wherein said first amplifier comprises fourth and fifth MOS transistors that are coupled in an analogous way to the way said first and second MOS transistors, respectively, of said first amplifier are coupled to form said first amplifier having a constant gain.

8. An apparatus according to claim 7 wherein a main current conducting electrode of said first MOS transistor that is remote from said junction terminal of said first amplifier is coupled at to a corresponding main current conducting electrode of said fourth MOS transistor at a second junction terminal and wherein a corresponding main current conducting electrode of said second MOS transistor is coupled to a corresponding main current conducting electrode of said fifth MOS transistor at a third junction terminal for developing at said second and third junction terminals corresponding signals at opposite phases, wherein said combining means combines the signals at said second and third junction terminals to form said oscillatory signal at a corresponding single terminal.

9. An apparatus according to claim 1 wherein said control signal is generated in phase-lock-loop circuit that is synchronized to said pilot signal component.

10. An apparatus according to claim 1 wherein said reactive means comprises an R—C network.

11. An apparatus according to claim 1 wherein said resonator comprises a crystal.

12. An apparatus according to claim 11 further comprising, a capacitance coupled to said crystal that causes said oscillator to form a Pierce type oscillator.

13. An apparatus according to claim 1 wherein said reactive means is coupled to an input terminal of said second amplifier such that an input signal at said input terminal of said second amplifier is phase shifted relative to an input signal at a corresponding input terminal of said first amplifier.

14. An apparatus according to claim 1 wherein said second amplifier comprises a differential amplifier having a variable gain for generating a fourth output signal that forms with said third output signal a pair of signals at opposite phases that are phase shifted, in accordance with the operation of said reactive means, relative to said first and second output signals, respectively.

15. An apparatus according to claim 14 further comprising, a differential third amplifier having a variable gain that generates fifth and sixth output signals at opposite phases wherein said combining means combines said first, third and fifth output signals to form a first combined output signal and further combines said second, fourth and sixth output signals to form a second combined output signal and wherein said first and second combined output signals are further combined to form said oscillatory signal.

16. An apparatus according to claim 15, wherein a gain of said third amplifier varies in accordance with said control signal in an opposite sense to that of said second amplifier.

17. An apparatus according to claim 16 wherein said second amplifier comprises first and second of MOS transistors that are coupled to form a differential amplifier, a third MOS transistor having a control electrode that is coupled to said control signal, said third MOS transistor having a main current conducting electrode that is coupled at a junction terminal between corresponding main current conducting electrodes of said first and second MOS transistors to provide a common source of current to both said first and second MOS transistors such that a variation in said control signal causes a corresponding conductivity variation in said third MOS transistor that causes a gain of said second amplifier to vary.

18. A controllable oscillator responsive to a control signal, said oscillator generating an oscillatory signal at a frequency that is controlled in accordance with said control signal, said controllable oscillator comprising:

an MOS first transistor;

an MOS second transistor having a main current conducting electrode that is coupled to a corresponding main current conducting electrode of said first MOS transistor to form a first differential amplifier that generates a first output signal;

an MOS third transistor having a main current conducting electrode that is coupled at a junction between said main current conducting electrodes of said first and second MOS transistors, said third MOS transistor having a control electrode that is responsive to said control signal such that a variation in said control signal causes a conductivity variation in said third MOS transistor that, in turn, causes a corresponding variation in a corresponding current that flows in said first MOS transistor and a corresponding variation in a current that flows in said second MOS transistor, said current variations in said first and second MOS transistors occurring in the same sense;

a second amplifier having a constant gain for generating a second output signal;

means for combining said first and second output signals to generate said oscillatory signal;

a resonator responsive to said oscillatory signal for generating at an output terminal thereof a signal in accordance with the frequency and phase response of said resonator that determines a range of frequencies from which said frequency of said oscillatory signal may be selected;

means including reactive phase shifting means coupled to said output terminal of said resonator for generating first and second input signals at first and second input terminals, respectively, of said first and second amplifiers such that a phase of said first input signal is shifted relative to that of said second input signal; and means responsive to a synchronizing input signal and to said oscillatory signal for generating said control signal that causes said oscillatory signal to be synchronized to said input signal in a phase-lock-loop manner.

19. An apparatus according to claim 18 wherein said first differential amplifier generates a third output signal such that said first and third output signals are at opposite phases and wherein said combining means combines said first, said second and said third output signals to form said oscillatory signal.

20. An apparatus according to claim 19 wherein said second amplifier comprises a differential amplifier that generates said second output signal and a fourth output signal such that said second and fourth output signals are at opposite phases and wherein said combining means combines said first, said second, said third and fourth output signals to form said oscillatory signal.

21. An apparatus responsive to a baseband composite signal that includes a synchronizing signal component, comprising:

a controllable oscillator responsive to a control signal, said oscillator generating an oscillatory output signal at a frequency that is controlled in accordance with said control signal, said controllable oscillator including:

means responsive to said control signal for generating first and second output signals that are at opposite phases;

a resonator responsive to said oscillatory output signal for generating at an output terminal thereof a third signal, said resonator having a frequency response that determines a range of frequencies from which said frequency of said oscillatory output signal can be selected;

means including reactive means for coupling said third signal to first and second input terminals of said first and second output signal generating means such that the signals at said input terminals have a phase difference therebetween;

a push-pull arrangement responsive to said first and second outpu signals for generating said oscillatory output signal in accordance with said first and second output signals; and means responsive to said synchronizing signal component and to said oscillatory output signal for generating said control signal to vary said phase of at least one of said first and second output signals for synchronizing said oscillatory output signal to said synchronizing signal component.

* * * * *